United States Patent
Kreeley et al.

(10) Patent No.: US 9,551,520 B2
(45) Date of Patent: Jan. 24, 2017

(54) HAZARDOUS LOCATION HEAT TRANSFER UNIT

(71) Applicant: Kooltronic, Inc., Pennington, NJ (US)

(72) Inventors: Bruce K. Kreeley, Langhorne, PA (US); Boris L. Muzikant, Pipersville, PA (US)

(73) Assignee: Kooltronic, Inc., Pennington, NJ (US)

( * ) Notice: Subject to any disclaimer, the term of this patent is extended or adjusted under 35 U.S.C. 154(b) by 0 days.

(21) Appl. No.: 15/225,955

(22) Filed: Aug. 2, 2016

(65) Prior Publication Data

US 2016/0341459 A1 Nov. 24, 2016

Related U.S. Application Data

(60) Continuation of application No. 14/662,884, filed on Mar. 19, 2015, which is a division of application No. 14/521,224, filed on Oct. 22, 2014, now Pat. No. 9,157,670.

(60) Provisional application No. 61/895,836, filed on Oct. 25, 2013.

(51) Int. Cl.
| | |
|---|---|
| *F25D 19/00* | (2006.01) |
| *F25D 11/02* | (2006.01) |
| *F25B 39/04* | (2006.01) |
| *F25B 49/00* | (2006.01) |
| *B23P 19/04* | (2006.01) |
| *H05K 7/20* | (2006.01) |
| *F28D 15/02* | (2006.01) |
| *F24F 13/20* | (2006.01) |

(52) U.S. Cl.
CPC .............. *F25B 49/005* (2013.01); *B23P 19/04* (2013.01); *F24F 13/20* (2013.01); *F28D 15/0266* (2013.01); *H05K 7/20554* (2013.01); *F25B 2500/06* (2013.01); *F28F 2265/00* (2013.01); *Y10T 29/49826* (2015.01)

(58) Field of Classification Search
CPC F25B 49/005; H05K 7/20554; F28F 2265/00; F24F 11/02
USPC .......................... 62/455, 441, 506–508, 498
See application file for complete search history.

(56) References Cited

U.S. PATENT DOCUMENTS

| | | | |
|---|---|---|---|
| 2,035,653 A | 3/1936 | Haskell | |
| 2,182,569 A | 12/1939 | Peo | |
| 2,234,771 A | 3/1941 | Moore | |
| 2,696,086 A | 12/1954 | Jones | |
| 3,003,683 A | 10/1961 | Matless et al. | |
| 3,150,584 A | 9/1964 | Allander | |
| 3,194,027 A | 7/1965 | Prendergast et al. | |

(Continued)

FOREIGN PATENT DOCUMENTS

JP 2001324170 A 11/2001

OTHER PUBLICATIONS

Specific Systems, Ltd., Product Data Sheet 600 Series Inpac Unit—Model 624, pp. 1-2 (2009).

(Continued)

*Primary Examiner* — Ryan J Walters
*Assistant Examiner* — Joseph Trpisovsky
(74) *Attorney, Agent, or Firm* — Weitzman Law Offices, LLC

(57) ABSTRACT

A two chamber heat transfer unit configured such that hazardous air can circulate through one of the chambers of the heat transfer unit and any potential ignition source components are contained in another pressurized chamber of the heat transfer unit.

19 Claims, 10 Drawing Sheets

(56) References Cited

U.S. PATENT DOCUMENTS

| | | | |
|---|---|---|---|
| 3,273,797 A | 9/1966 | Grahl | |
| 3,279,209 A | 10/1966 | Laing | |
| 3,293,875 A | 12/1966 | Kelly | |
| 3,364,838 A | 1/1968 | Bradley | |
| 3,585,273 A | 6/1971 | Paul | |
| 3,597,935 A | 8/1971 | Pierrat | |
| 3,680,258 A | 8/1972 | Loyd | |
| 3,686,893 A | 8/1972 | Edwards | |
| 3,727,424 A | 4/1973 | Edens et al. | |
| 3,789,621 A | 2/1974 | Inuzuka | |
| 3,819,244 A | 6/1974 | Paulick et al. | |
| 3,859,816 A | 1/1975 | McDonald et al. | |
| 3,911,693 A | 10/1975 | Siegler et al. | |
| 3,982,405 A * | 9/1976 | Seigler | F24F 1/02 327/456 |
| 3,991,819 A | 11/1976 | Clark | |
| 4,205,246 A | 5/1980 | Wise et al. | |
| 4,802,502 A * | 2/1989 | Williams | A62B 13/00 137/377 |
| 4,963,693 A | 10/1990 | Kodl | |
| 5,192,194 A | 3/1993 | Birdwell | |
| 5,255,532 A | 10/1993 | Chee et al. | |
| 5,324,229 A | 6/1994 | Weisbecker | |
| 5,341,860 A | 8/1994 | Klein | |
| 5,638,693 A | 6/1997 | Baek | |
| 5,657,641 A * | 8/1997 | Cunningham | H05K 7/20681 361/691 |
| 5,709,100 A | 1/1998 | Baer et al. | |
| 5,943,873 A | 8/1999 | Chung | |
| 6,134,109 A | 10/2000 | Muller et al. | |
| 6,202,429 B1 * | 3/2001 | Kinkel | F24F 1/022 165/225 |
| 6,508,071 B2 | 1/2003 | Ota et al. | |
| 7,132,601 B1 | 11/2006 | Seff | |
| 7,249,468 B2 | 7/2007 | Roston | |
| 7,270,691 B2 | 9/2007 | Arts et al. | |
| 7,350,371 B2 | 4/2008 | Lee et al. | |
| 7,850,438 B2 | 12/2010 | Sato et al. | |
| 9,157,670 B2 * | 10/2015 | Kreeley | B23P 19/04 |
| 2001/0035023 A1 | 11/2001 | Kuo | |
| 2004/0187517 A1 | 9/2004 | Solomon | |
| 2005/0183451 A1 * | 8/2005 | Roston | F25B 41/04 62/509 |
| 2010/0041327 A1 | 2/2010 | Desler | |
| 2012/0291458 A1 | 11/2012 | Siebert et al. | |

OTHER PUBLICATIONS

Specific Systems, Ltd., Product Data Sheet 600 Series Inpac Unit—Model 6090, pp. 1-2 (2009).

* cited by examiner

HAZARDOUS LOCATION HEAT TRANSFER UNIT

CROSS REFERENCE TO RELATED APPLICATION

This application is a continuation of U.S. patent application Ser. No. 14/622,884, which is a divisional of U.S. patent application Ser. No. 14/521,224, filed Oct. 22, 2014 (now U.S. Pat. No. 9,157,670), which claims the priority benefit of U.S. Provisional Patent Application No. 61/895,836, filed Oct. 25, 2013, all of the foregoing are incorporated herein by reference in their entirety as if fully set forth herein.

BACKGROUND

1. Field

This disclosure relates generally to heat transfer units, like air conditioners and heat exchangers, and, more particularly, to heat transfer units used in hazardous environments.

2. Background

In industrial applications, it is not uncommon to have locations where cooling or heat transfer from a location or housing is needed, yet the ambient atmosphere in the area to which the heat will be transferred contains fine dust or flammable vapor or chemicals which, when subjected to high heat or localized arcing, become overly corrosive (such locations being individually and collectively referred to herein as "hazardous environments"). Such environments can pose a hazard because most conventional air conditioning or heat exchanger units contain components that have elements which should not be exposed to the hazardous environment, for example, motors, switches and relays, because they have the potential to create sparks or have one or more sufficiently hot surfaces that can interact with the dust or vapor to cause an explosion or ignition Likewise, those sparks and/or hot surfaces can cause localized atmospheric chemicals to react with and quickly degrade components of the units themselves.

In an effort to address this problem, conventional heat transfer units that are used in such environments typically employ remedial approaches, such as relying upon use of explosion-proof hardware and enclosures, incorporating energy-limiting devices to reduce the possibility of arcing, or relocating spark-producing or high heat-producing components to locations well-removed from the hazardous environment. All such approaches however increase cost and complexity of the units.

Thus, there is a need for heat transfer units that can be used in hazardous locations but do not require such high cost and/or complex remedial efforts that have the effect of reducing reliability of their components relative to their normal counterpart components (e.g., non-explosion proof or energy-limiting).

BRIEF SUMMARY

One aspect involves a heat transfer unit for use in a location where heat will be transferred by the unit from a heat source in an enclosure to ambient hazardous air. The heat transfer unit has a housing includes a first compartment, configured for coupling to and removing heat from the enclosure, the first compartment having therein an evaporator, and potential ignition source elements within the heat transfer unit. The housing also includes a second compartment including an ambient hazardous air inlet, an ambient hazardous air outlet, and a condenser, the ambient hazardous air inlet and ambient hazardous air outlet being arranged within the second compartment such that, in use, ambient hazardous air will move into second compartment via the ambient hazardous air inlet, past the condenser, and out the ambient hazardous air outlet. The evaporator and condenser are coupled to each other via piping so as to collectively comprise a cooling circuit for passage of a cooling medium therebetween. The first compartment is sealed off from the second compartment such that, during operation of the heat transfer unit, the first compartment will be sealed off from the ambient hazardous air. The heat transfer unit is configured such that, during operation, an interior of the first compartment is maintained at an internal pressure that is higher than an interior pressure in the second compartment.

Another aspect involves a heat transfer unit for use in a location where heat will be transferred by the unit from a heat source to ambient hazardous air. The heat transfer unit has a cooling circuit comprising an evaporator, a condenser, a coolant and passages to contain the coolant and allow the coolant to circulate between the evaporator and condenser; a first compartment including therein the evaporator and ignition source elements of the heat transfer unit; and a second compartment including the condenser and elements that are not ignition source elements therein. During operation of the heat transfer unit, heat removed from the heat source by the evaporator will be transferred to the ambient hazardous air, via the coolant of the cooling circuit, by passing the ambient hazardous air past coils of the condenser. In addition, the evaporator compartment is sealed off from the condenser compartment such that, during operation of the heat transfer unit, an internal pressure in the evaporator compartment will be higher than an internal pressure in the condenser compartment so as to minimize infiltration of the ambient hazardous air to the ignition source elements within the evaporator compartment of the heat transfer unit.

Yet another aspect involves a heat transfer unit for use in a location where heat will be transferred by the unit from a heat source to ambient hazardous air. The heat transfer unit has a cooling circuit comprising an evaporator, a condenser, a coolant and passages to contain the coolant and allow the coolant to circulate between the evaporator and condenser; a first compartment including therein the evaporator and any ignition source elements of the heat transfer unit; and a second compartment having no potential ignition source elements therein, but including at least the condenser therein. During operation of the heat transfer unit, heat will be removed from the heat source by the evaporator and transferred to the ambient hazardous air, via the coolant of the cooling circuit, by passing the ambient hazardous air past the condenser using blades of a fan. Also, the evaporator compartment is sealed off from the condenser compartment such that, during operation of the heat transfer unit, an internal pressure in the evaporator compartment will be higher than an internal pressure in the condenser compartment.

The foregoing and following discussion outlines rather generally the features and technical advantages of one or more embodiments of this disclosure in order that the following detailed description may be better understood. Additional features and advantages of this disclosure will be described herein and may be the subject of claims of this application.

BRIEF DESCRIPTION OF THE DRAWINGS

This disclosure is further described in the detailed description that follows, with reference to the drawings, in which.

DETAILED DESCRIPTION

Before describing the details of the devices and approaches herein, it should be understood that, as used herein, the term "hazardous location" is intended to broadly mean any location (irrespective of geographic location) meeting the National Electrical Code definition of a "Class I, Division 1" location where materials in one or more of Groups A, B, C and/or D are present, and/or meeting the definition of that Code corresponding to a "Class II, Division 1" location where materials in one or more of Groups D, E and/or F are present.

In addition, as used herein, the term "hazardous air" is intended to mean and encompass air in which flammable gases or vapors may be present in sufficient quantities to be explosive or ignitable, or air containing combustible dust or fiber in sufficient quantities so as to be explosive or ignitable such that the location where the hazardous air is present will be a hazardous location as defined herein.

Finally, as used herein, the term "ignition source" is intended to broadly mean any part or component that gets hot enough to cause ignition or explosion of hazardous air, or causes localized arcing or sparks that, when hazardous air is present, can cause ignition or explosion due to the hazardous air. Examples of heat sources can include, but are not limited to, motors, generators, compressors, the rotors or brushes of a motor, switches, relays, components that can build up a static charge and discharge across a gap (i.e., arc), etc.

With those definitions in mind, some example inventive heat transfer unit variants will now be described as representative example implementations employing the invention as claimed.

Figure 1:
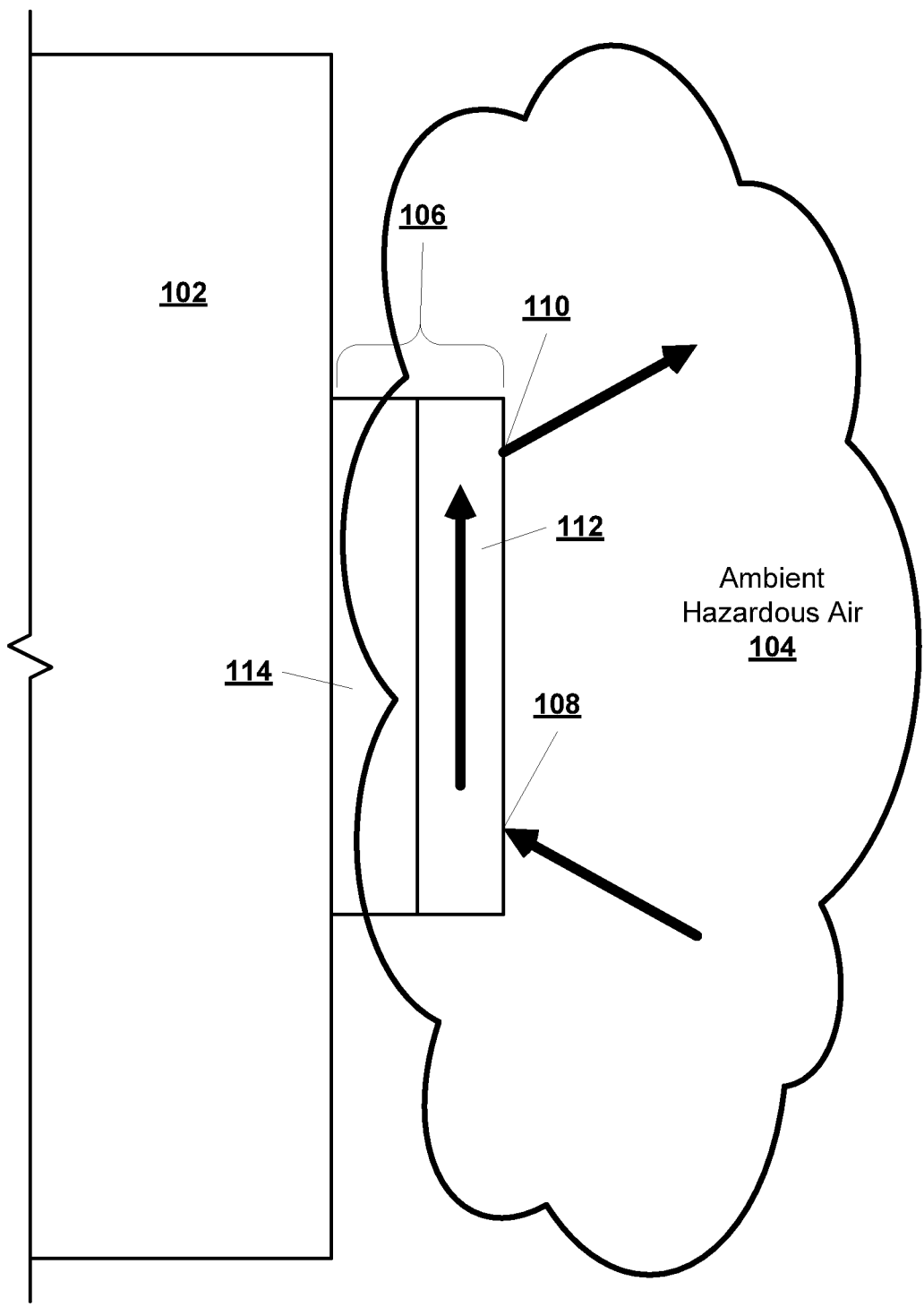
FIG. 1 illustrates, in simplified form, one example implementation of a heat transfer unit in an example hazardous environment.

As a simplified general overview, FIG. 1 illustrates, in simplified form, one example implementation of a heat transfer unit, constructed according to one of the variants described herein, for cooling electrical equipment in a cabinet located in an example hazardous location.

As shown in FIG. 1, an electrical equipment-containing cabinet 102 to be cooled is present in a hazardous environment 104. A heat transfer unit 106, constructed and configured as described herein, is connected to the electrical equipment-containing cabinet 102 to be cooled. In operation, the heat transfer unit 106 will remove heat from the electrical equipment-containing cabinet 102 using a conventional heat transfer or refrigeration circuit in which a conventional coolant/refrigerant repeatedly undergoes phase changes as it is circulated between a condenser and evaporator.

With conventional cooling devices for use in a hazardous environment, special explosion-proof components, or components and circuits designated "intrinsically safe" or "electrically safe" to avoid the possibility of ignition or explosion, must be used. However, in advantageous contrast to conventional heat transfer unit configurations, the heat transfer unit 106 does not require use of either. This is accomplished by a construction approach that divides the heat transfer unit 106 into at least two chambers 112, 114 that are essentially sealed off from each other.

In general, the first chamber 112 is exposed to, and circulates, ambient hazardous air 104, to which heat removed from the device to be cooled is transferred. As such, it is constructed to only contain components for which there is no risk of a spark or ignition temperatures.

In general, the second chamber 114 is coupled to the cabinet 102 to be cooled but is sealed off from the first chamber 112 and the ambient hazardous air 104. The second chamber 114 contains the cooling components as well as any components that could potentially cause a spark or heat to (or above) temperatures that would cause the hazardous ambient air to ignite or explode.

Through this two-chamber 112, 114 approach, as will be described in greater detail below, the ambient hazardous air 104, and the air within the cabinet 102 to be cooled, do not generally mix. Advantageously, as a result, conventional (i.e., those that are not explosion proof, low power, "intrinsically safe" or "electrically safe") components can be used within the second chamber 114, saving cost and complexity.

Specific details and several example alternative implementations of this approach will now be discussed.

Figure 2:
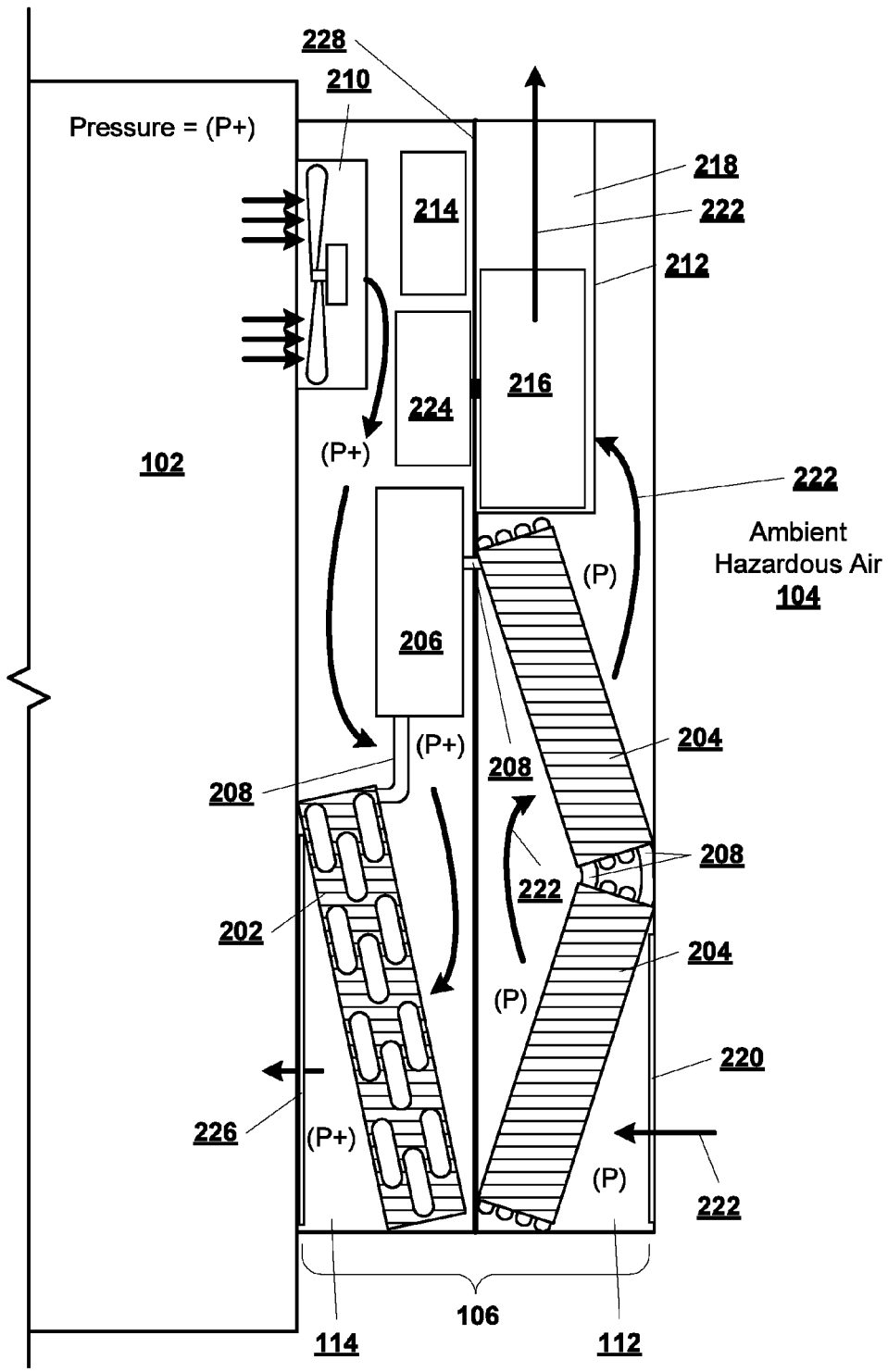
FIG. 2 illustrates, in simplified form, a side view of the interior of one example heat transfer unit variant implemented as described herein.

FIG. 2 illustrates, in simplified form, a side view of the interior of one example heat transfer unit variant implemented as described herein. As shown in FIG. 2, an electrical equipment-containing cabinet 102 to be cooled is present in ambient hazardous air 104. A heat transfer unit 106 is coupled to the electrical equipment-containing cabinet 102 to be cooled and constructed such that it has at least two chambers 112, 114. The heat transfer unit 106 includes a conventional refrigeration circuit made up of an evaporator 202, a condenser 204, other components 206, such as, for example, one or more of: a compressor, expansion valve(s), reversing valve(s), sensors, control electronics, electrical heater(s), etc., and piping 208 that allows a heat transfer medium or refrigerant to be circulated therewithin. The heat transfer unit 106 also includes a fan 210 that causes the air to be cooled to circulate past the coils of the evaporator 202 and, as shown, a blower fan 212 (also interchangeably sometimes referred to as a centrifugal fan or squirrel cage fan) that causes ambient hazardous air 104 to circulate past the coils of the condenser 204 and remove heat emitted therefrom. In addition, the heat transfer unit 106 will also contain other components 214 conventionally contained in heat transfer units used for the same or similar purposes, components such as, for example, switches, circuit breakers, sensors, electrical or electronic circuitry and wiring to supply power to its various powered parts, as well as control electronics, etc.

In contrast to such conventional units, however, the components of the heat transfer unit of FIG. 2 are advantageously arranged in an unconventional fashion.

Specifically, as shown in FIG. 2, the components are arranged such that only the condenser 204 coils and the blades 216 and plenum 218 of the blower 212 are within the chamber 112 through which the hazardous air 104 will circulate from the inlet 220, along the path 222 indicated by the flow arrows through the chamber 112 to the blower 212 where it will be expelled back out into the ambient hazardous air 104. Thus, only these components (and part of the shaft of the blower fan 212 and some piping associated with the condenser 204) will be exposed to the hazardous air 104. Stated another way, no potential ignition source is present in that chamber 112.

Moreover, any piping 208 that passes through the wall 228 between the two chambers 112, 114 will be sealed on their exterior to the wall 228, for example, by welding or other appropriate known approach, such that hazardous air 104 cannot pass between the chambers at the wall-piping junction.

Likewise, as shown in FIG. 2, the other chamber 114 (through which air, nitrogen or inert gas from the electrical equipment-containing cabinet 102 will circulate for cooling) houses all of the other components, such as for example, the evaporator 202, other components 206, the motor 224 of the blower fan 212, and all potential ignition sources. In other words, the air or ambient gas (nitrogen or inert gas) from within the electrical equipment-containing cabinet 102 will be drawn into that chamber 114 by a fan 210, circulate through the chamber 114 to and through the evaporator 202 and then re-enter the electrical equipment-containing cabinet 102 via an outlet 226.

Again, it is worth specifically noting that the two chambers 112, 114 are isolated from each other such that essentially none of the hazardous air 104 passing through the chamber 112 will enter the other chamber 114. In this regard, it should be noted that the only possible source of cross flow between the two chambers 112, 114 exists, in the example variant of FIG. 2, at the point where shaft of the blower fan 212 passes through the wall 228 dividing the two chambers 112, 114. With some variants, this possibility can be significantly reduced, if not eliminated, by maintaining the chamber 114 at a higher pressure (P+) than the pressure (P) in the chamber 112 through which the hazardous air 104 will flow such that, any leakage will be from the chamber 114 containing the potential ignition sources 224 to the chamber 112 through which the hazardous air 104 will flow instead of the other way around. In other variants, a sufficiently tight seal about the shaft or, for example, a labyrinth seal, other tortuous path seal, may be used such that any leakage of hazardous air 104 into the chamber 114 that contains potential ignition sources 224 is negligible, if it occurs at all, (i.e., infiltrating hazardous air, if any, will always be sufficiently dilute relative to the overall air, nitrogen or inert gas into which it may leak so as to present no danger of ignition or explosion).

Returning to FIG. 2, it is worthwhile to point out that the condenser 204 is illustrated, in this example, as a two-part condenser so that the entering hazardous air 104 passes through the first and then the second condenser before the blower 212 exhausts it back out of the chamber 112. It is to be recognized that the condenser 204 could have alternatively been shown as a single condenser or it could have been shown as made up of multiple smaller condensers to increase the surface area for transfer of heat. Throughout this document, it should be understood that numerous alternative configurations and layouts of the condenser 204 and evaporator 202, could alternatively be used for purposes of, for example, conserving space, increasing surface area, to allow for specific placement of pumps, motors, valves, electronics, etc. without departing from the principles of the invention which, in the most basic form, places those components that could potentially cause ignition or explosion of the hazardous air into a chamber that is isolated from the hazardous air and, commonly, but not necessarily, in the path of the air or gas that passes through that chamber (irrespective of whether that chamber is used to transfer heat away from a heat source (i.e., for cooling) or to a volume (i.e., as a heat pump for heating)), or in an area where a purge/pressure system can remove, or prevent accumulation of, stagnant or leaked hazardous air within some volume, for example, part of a motor housing or near a corner of a chamber.

Figure 3A:
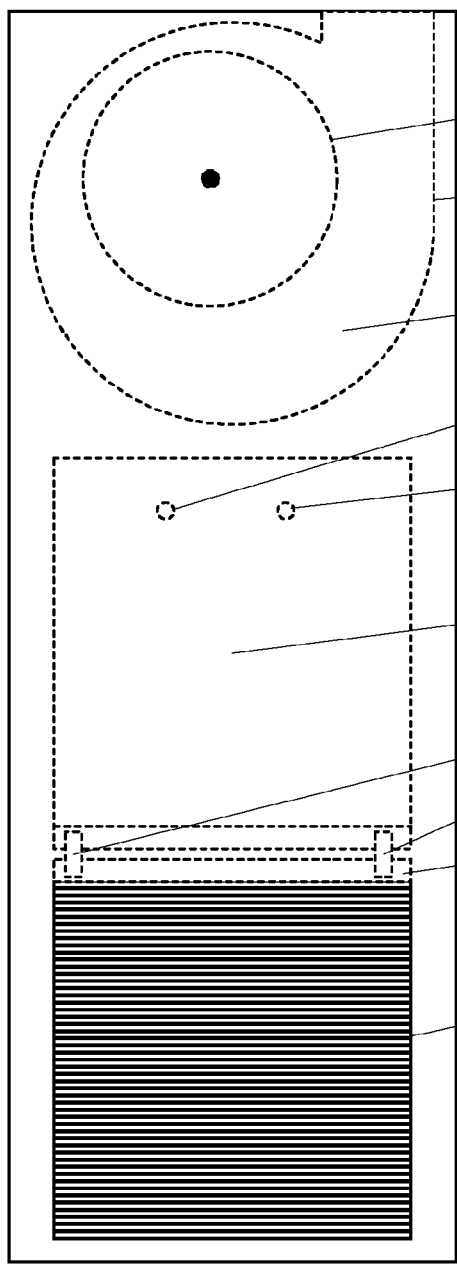
FIGS. 3A-3B respectively illustrate, in simplified form, example exterior face panels of the heat transfer unit of FIG. 2.
Figure 3B:
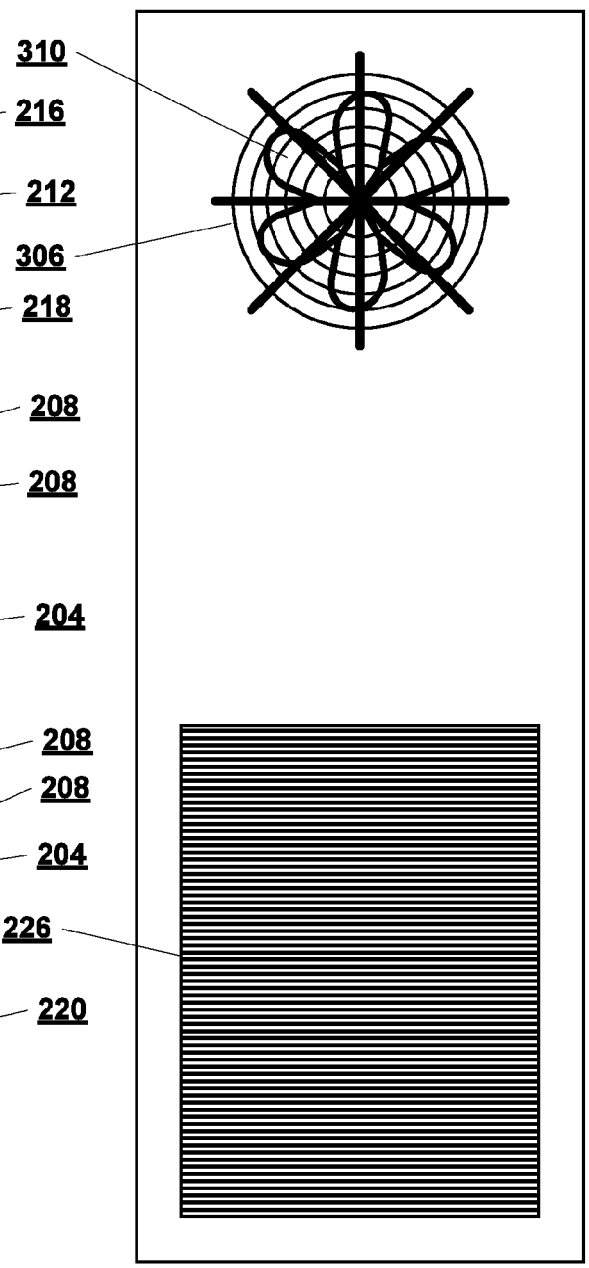

FIGS. 3A-3B respectively illustrate, in simplified form, example exterior face panels 302, 304 of the heat transfer unit 106 of FIG. 2 for both the hazardous air facing chamber 112 (FIG. 3A) and the electrical component-containing cabinet facing chamber 114 (FIG. 3B).

As can be better seen in the panel 302 of FIG. 3A, the intake 220 for the hazardous air is sized to provide maximum access to the lower of the two parts of the condenser 204 (only a portion of which is visible). In addition, from this view, it is more apparent that the blower 212 inside the chamber 112 is of the type known as a centrifugal blower, which uses a squirrel cage fan 216 to expel the hazardous air from the chamber 112.

In the panel 304 of FIG. 3B, the intake 306, through which air, nitrogen or inert gas will be drawn by the axial fan 210 from the electrical equipment-containing cabinet 102 into the chamber 114, and the outlet 226, via which the air, nitrogen or inert gas will be returned to the electrical equipment-containing cabinet 102, can be better seen.

Figure 4:
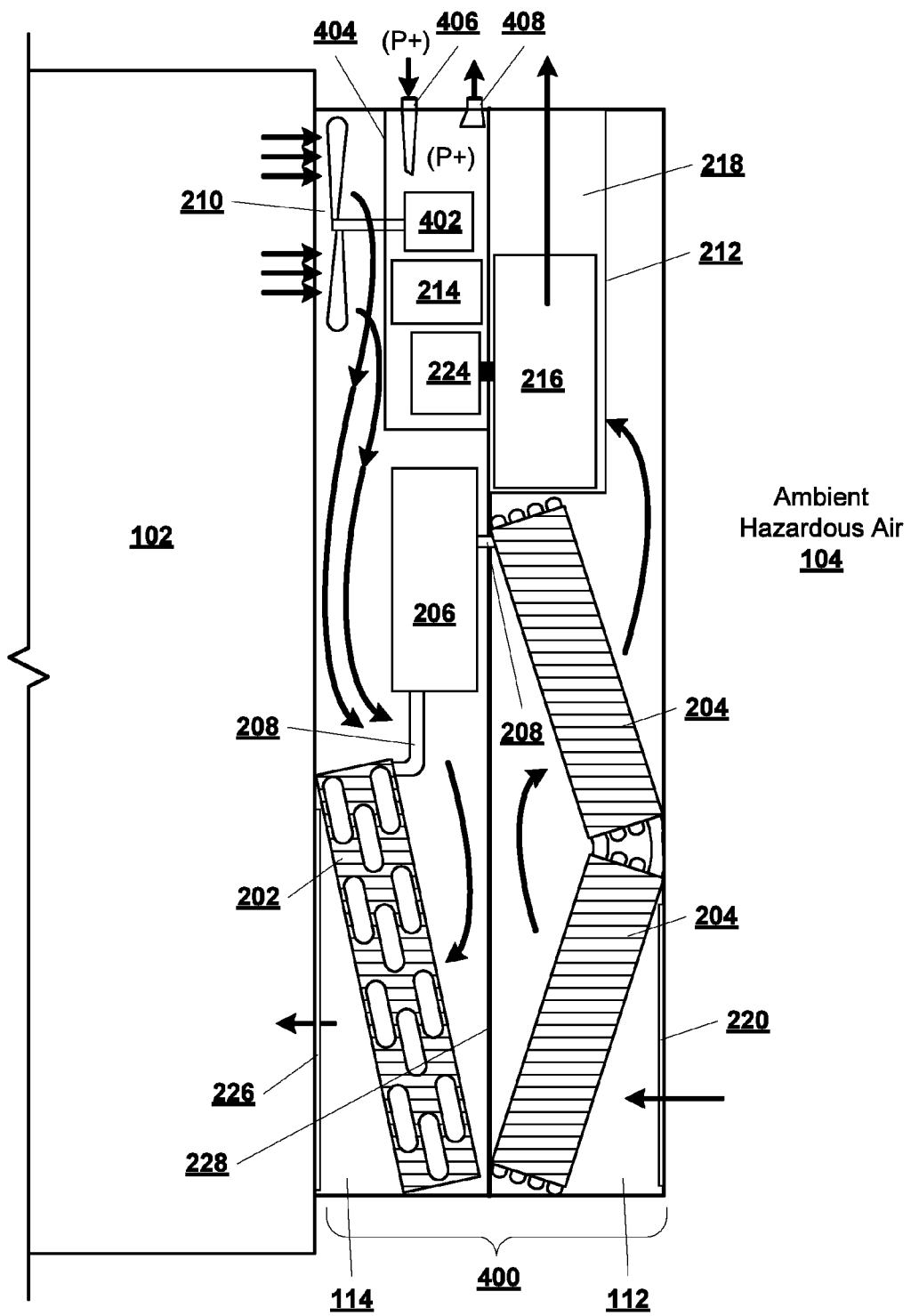
FIG. 4 illustrates, in simplified form, a side view of the interior of an example alternative variant heat transfer unit.

FIG. 4 illustrates, in simplified form, a side view of the interior of an example alternative variant heat transfer unit 400 that is similar to the heat transfer unit 106 of FIG. 2 except that the conventional components 214 that could potentially be an ignition source, the motor 224 for the blower 212 and the motor 402 of the axial fan 210 are all contained within a sub-chamber 404 of the main chamber 114. In addition, the sub-chamber 404 is configured with an inlet 406 and an outlet 408 for a conventional pressure/purge system (not shown in this figure). In the unit 400 of this figure, the pressure/purge system uses a compressor (or appropriate pump) to introduce nitrogen, an inert gas or air, under pressure into the sub-chamber 404 via the inlet 406 to thereby maintain the sub-chamber at a higher pressure (P+) than at least the pressure in the chamber 112 through which the hazardous air 104 will pass, again so that leakage of the hazardous air 104 into the vicinity of the blower motor 224, the fan motor 402 or the conventional components 214 that could be an ignition source will be minimized, if not eliminated. In this variant implementation, the outlet 408 acts as a check valve to prevent over-pressurizing of the sub-chamber 404.

Thus, it should be appreciated that, with this variant, there is no need to regulate the pressure in the entire chamber 114 relative to the chamber 112 through which the hazardous air will pass, which, depending upon the size of the unit 400, may be more difficult or expensive to accomplish. Rather, it is only necessary to maintain the higher pressure in the vicinity of the location where hazardous air might otherwise infiltrate, so as to minimize infiltration to below a safe level or eliminate it entirely.

Figure 5:
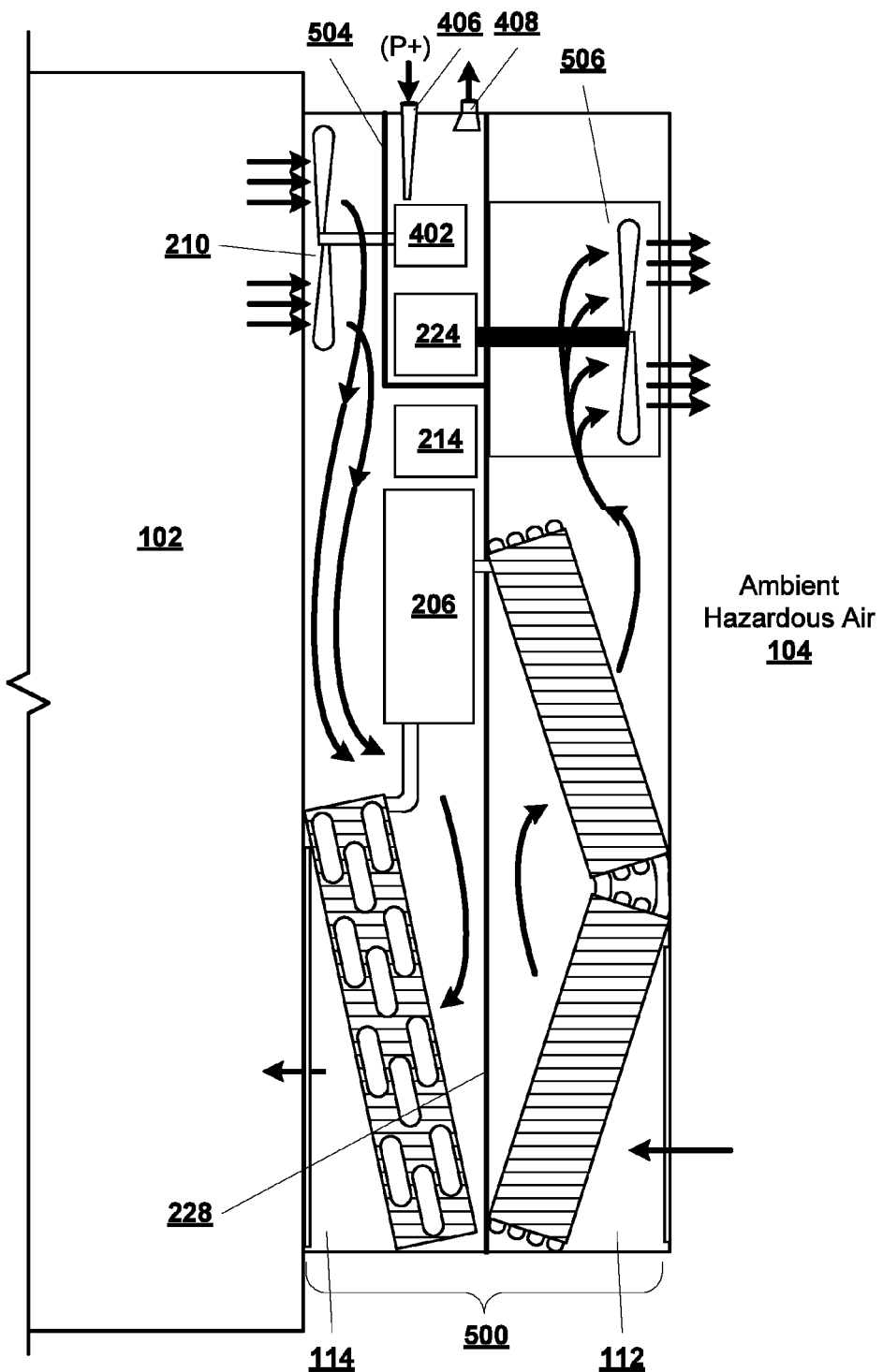
FIG. 5 illustrates, in simplified form, a side view of the interior of another example alternative variant heat transfer unit.

FIG. 5 illustrates, in simplified form, a side view of the interior of another example alternative variant heat transfer unit 500 that is almost identical to the heat transfer unit 400 of FIG. 4 except that, with this variant, only the blower 212 has been replaced by an axial fan 506 and only the motor 224 of the axial fan 506 and the motor 402 of the fan for the intake of the chamber 114 containing the potential ignition sources are contained within a pressurized sub-chamber 504 within the chamber 114.

Figure 6:
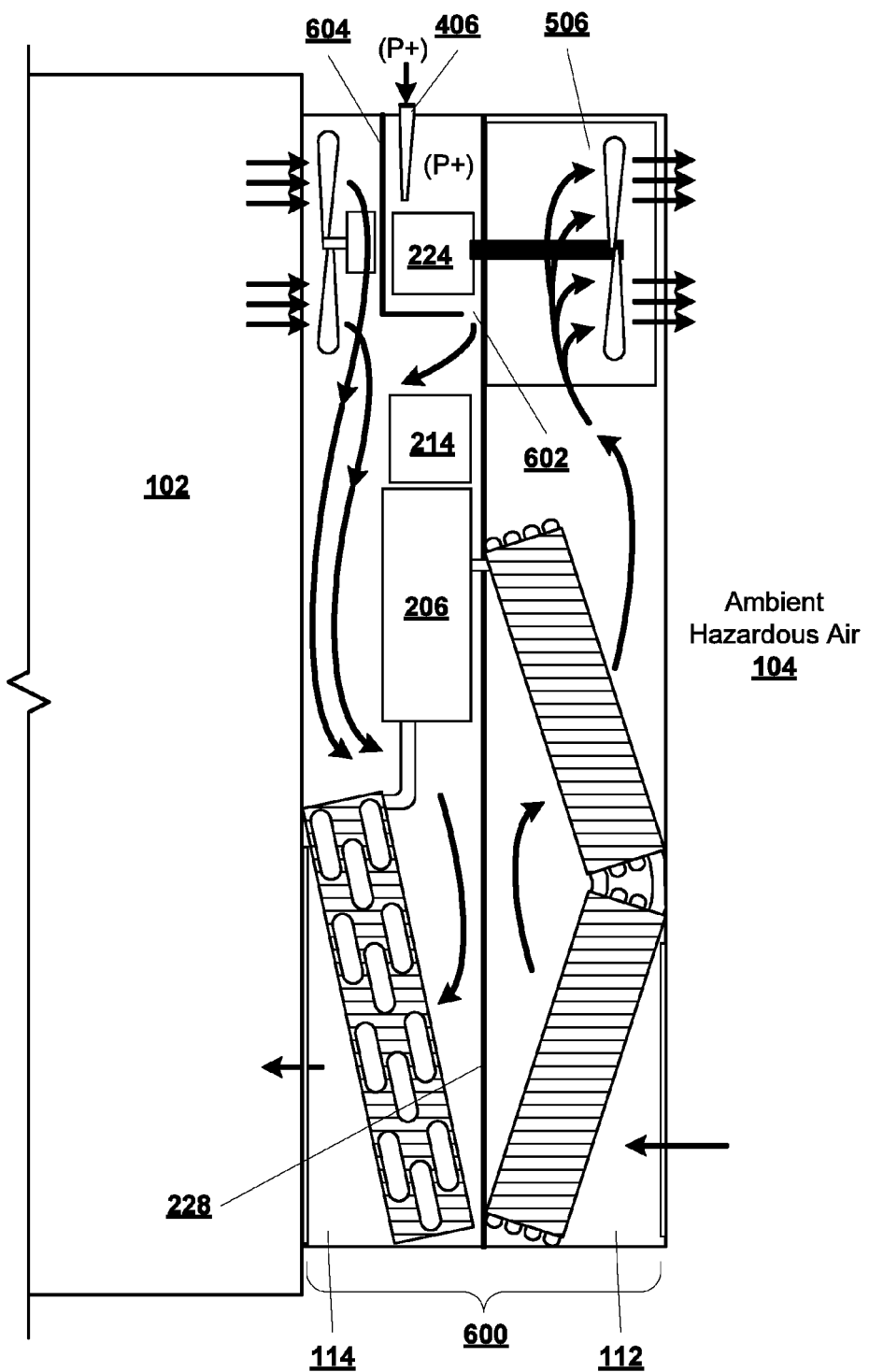
FIG. 6 illustrates, in simplified form, a side view of the interior of yet another example alternative variant heat transfer unit.

FIG. 6 illustrates, in simplified form, a side view of the interior of yet another example alternative variant heat transfer unit 600 that is almost identical to the heat transfer unit 500 of FIG. 5 except that, in this variant, only the motor 224 for the axial fan 506 is in the pressurized sub-chamber 604 and the pressurized sub-chamber 604 is not closed off or otherwise isolated from the chamber 114 within which it resides. Rather, the pressurized sub-chamber 604 includes an opening 602 coupling the sub-chamber 604 to the chamber 114. The opening 602 is sized to allow the pressure in the sub-chamber 602 to be maintained at a pressure (P+) that is higher than the pressure in the chamber 112 for the hazardous air 104 while allowing for pressure regulation by venting over pressure from the sub-chamber 602 into the main chamber 114. Depending upon the particular implementation, the opening 602 can simply be implemented as an appropriate sized hole or it can be implemented using some form of known check valve or other known vent that can open when the pressure exceeds some value and then close when the pressure falls below that value.

Figure 7:
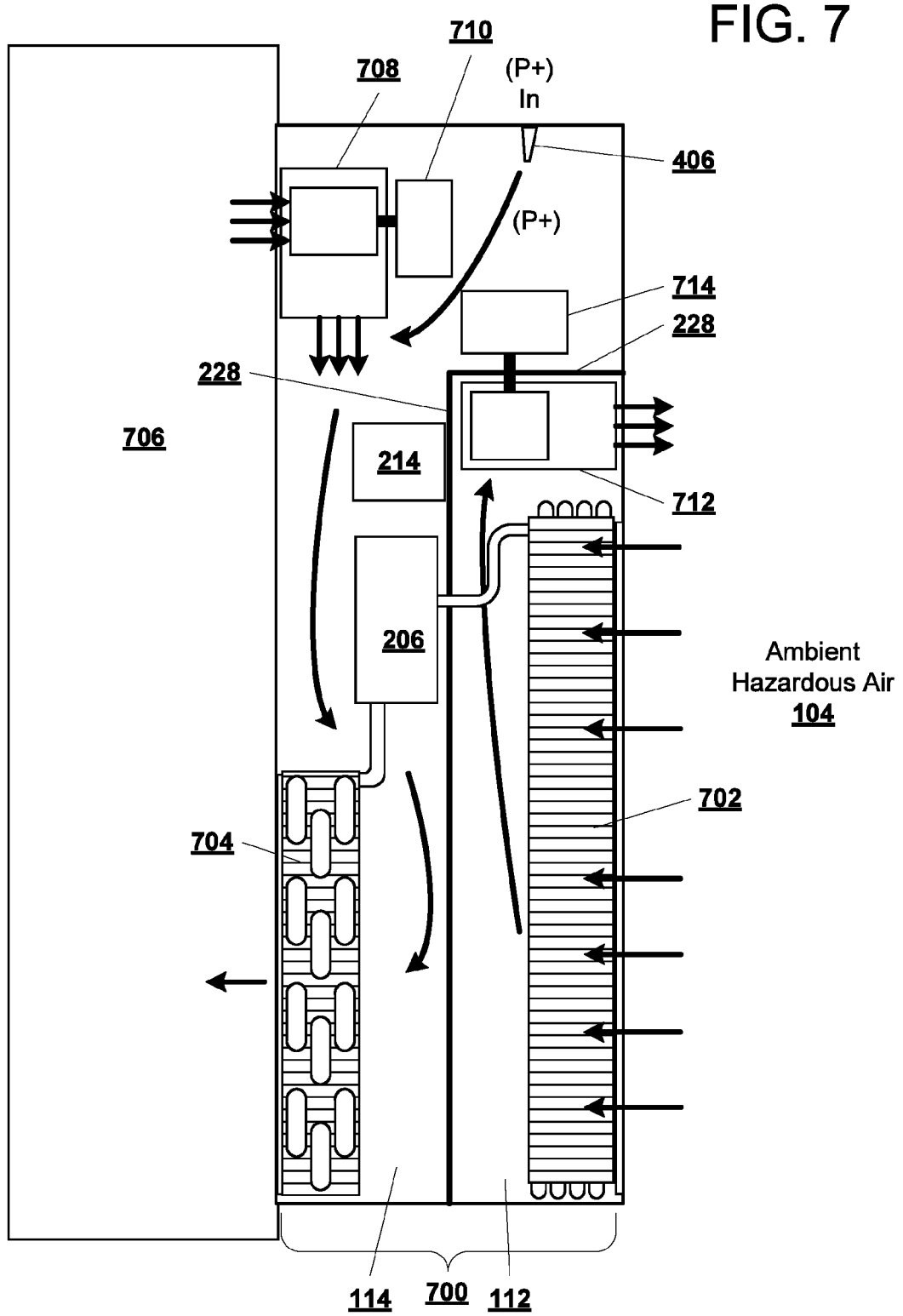
FIG. 7 illustrates, in simplified form, a side view of the interior of a further example alternative variant heat transfer unit.

FIG. 7 illustrates, in simplified form, a side view of the interior of a further example alternative variant heat transfer unit 700 configured as a heat pump to provide heating to a volume 706 sealed off from the hazardous air 104. As shown in FIG. 7, the unit 700 uses the same two-chamber 112, 114 approach described above, except that the chamber 112 exposed to the hazardous air 104 now merely contains an evaporator coil 702 and the plenum and fan portion 712 of a blower (and may also contain other components that are not potential ignition sources). Likewise, since this configuration is for heating, the other chamber 114 contains the condenser coil 704, the other relevant components 206 that may be part of the heat pump circuit, the various components 214 that could be ignition sources, a fan 708 of a blower and its associated motor 710, as well as the motor 714 for the fan 712. Thus, it can be seen that different configurations can be configured with all blowers, all axial fans or some combination thereof as appropriate.

In addition, as with some of the previous variants, this configuration is connected to a purge/pressurization system, only the output nozzle 406 of which is shown, to maintain a higher pressure (P+) in the chamber that contains the potential ignition source(s) 214 than the pressure in the chamber 112 through which the hazardous air 104 will pass so that hazardous air leakage via the shaft between the motor 714 and the blower 712 can be minimized to an acceptable level, if not eliminated entirely.

Moreover, as shown, the wall 228 separates the two chambers 112, 114 into unequal sized chambers that are not both purely vertical. It should now likewise be appreciated that that the particular sizing of the two chambers 112, 114 or their orientation, may well depend upon the particular intended application and available space. For example, in some variants, the heat transfer unit may be configured to mount on top of the cabinet to be cooled or heated, instead of along side of it. In such cases, depending upon the particular design, the two chambers 112, 114 could be configured with the chamber 112 through which the hazardous air 104 circulates could be on top of the other chamber 114 or along side it in a more horizontal configuration. Thus, it should be understood that the important aspect is having the chamber through which the hazardous air will circulate contain none of the components that are potential ignition sources and a separate other chamber sealed to the volume to be cooled or heated so that the hazardous air cannot enter the volume or the other chamber in any concentration near one that that could pose a hazard, if it can enter at all.

Figure 8:
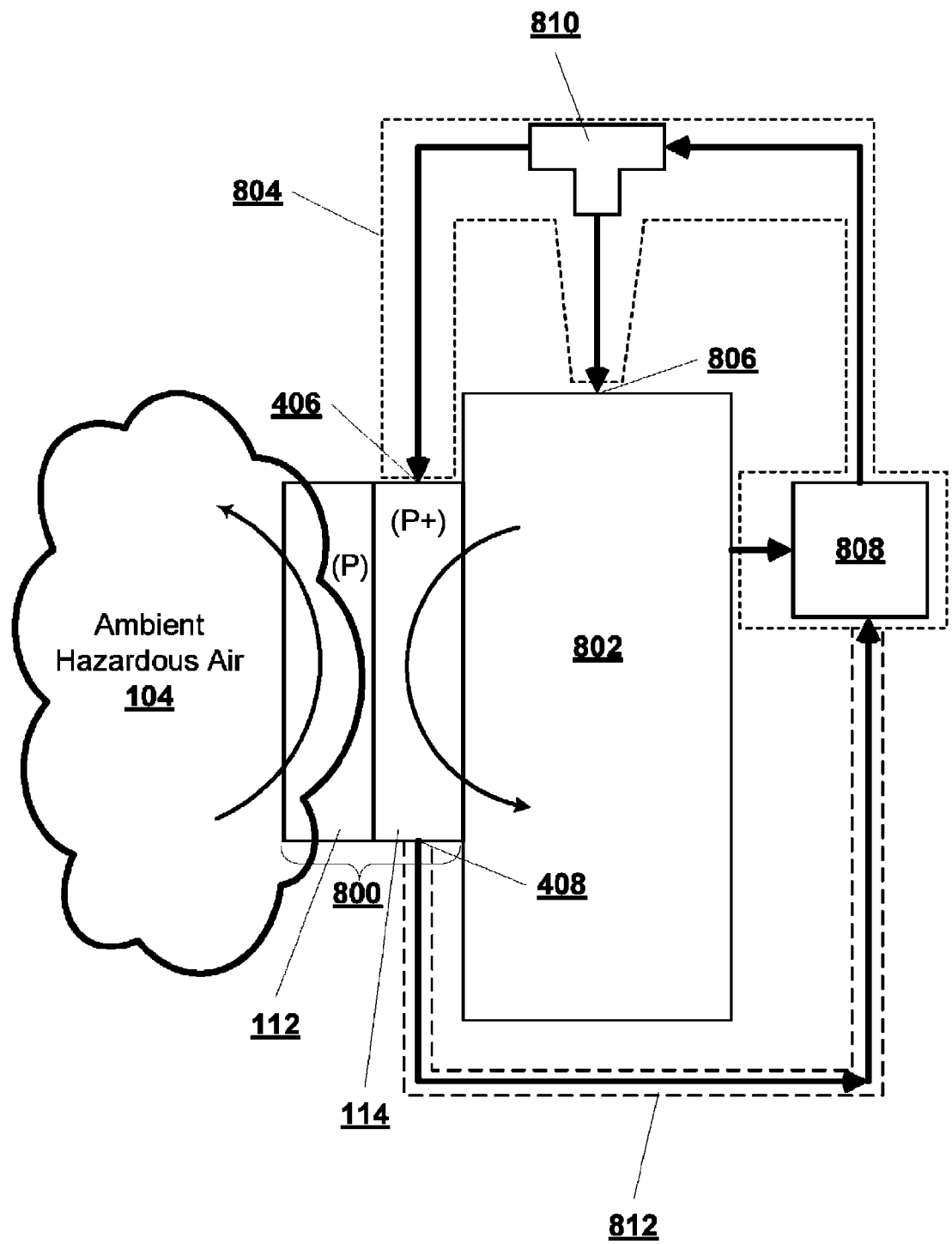
FIG. 8 illustrates, in simplified overview form, a representative example of a purge pressurization system connected to heat transfer unit for use in an environment having ambient hazardous air 104.

FIG. 8 illustrates, in simplified overview, a functional representative example of a purge pressurization system connected to heat transfer unit 800, which may be a cooling unit or heat pump configured with two chambers 112, 114 as described previously, for use in an environment having ambient hazardous air 104. The heat transfer unit 800 is shown as sealed to a volume or enclosure 802 (itself sealed off from the hazardous air 104) to or from which it will transfer heat as described above. In addition, FIG. 8 illustrates, in simplified overview functional (not physical) form, an example optional purge/pressurization system 804 coupled to (as shown) the volume or enclosure 802 via its own inlet 806, and to the heat transfer unit 800 via an inlet 406 on it as noted above. The optional purge/pressurization system 804 conventionally circulates nitrogen, air or an inert gas under pressure and, to do so, includes various components 808, for example, a source of nitrogen, air or inert gas, a pressurization pump, tank, compressor or blower, a filter, and other conventional components typically found in such systems. In addition, the purge/pressurization system 804 may further include auxiliary aspects 810, for example, one or more pressure switches, a metering valve or a vent. As a further option, for heat transfer units with both a purge/pressurization system inlet 406 and outlet 408, and/or a closed path purge/pressurization system, the purge/pressurization system 804 may additionally include a return path 812 that allows the nitrogen, air or inert gas to return to the pressurization pump or blower component(s) 808. For non-closed path configuration systems (i.e., where the nitrogen, air or inert gas does not return, but rather is vented, the illustrated return path 812 may simply be a control feedback path (electrical or mechanical).

At this point, it should be noted that the purge/pressurization system is an optional adjunct to the heat transfer units as described herein. In other words, such a system could already be part of the volume or enclosure 802 to be heated or cooled and tapped into for use with a heat transfer unit or it could be provided as part of the heat transfer unit, or some combination thereof, or it could be dispensed with entirely if the nitrogen, air or inert gas in the volume or enclosure 802 to be heated or cooled can be introduced into the chamber 114 at a sufficient pressure to maintain the chamber at a sufficiently higher pressure (P+) than the pressure in the other chamber 112 through which the hazardous air 104 will pass.

Figure 9A:
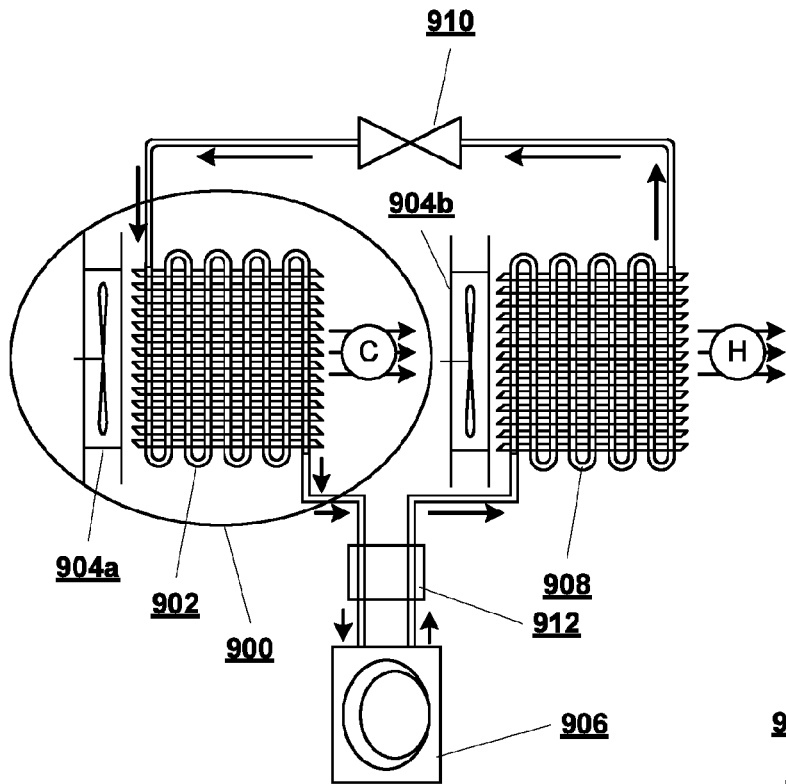
FIGS. 9A-9B respectively illustrate, in simplified overview form, an example of how some variants of the same heat transfer unit as described herein can, by employing techniques well known in the prior art, function as both a cooling unit and a heat pump.
Figure 9B:
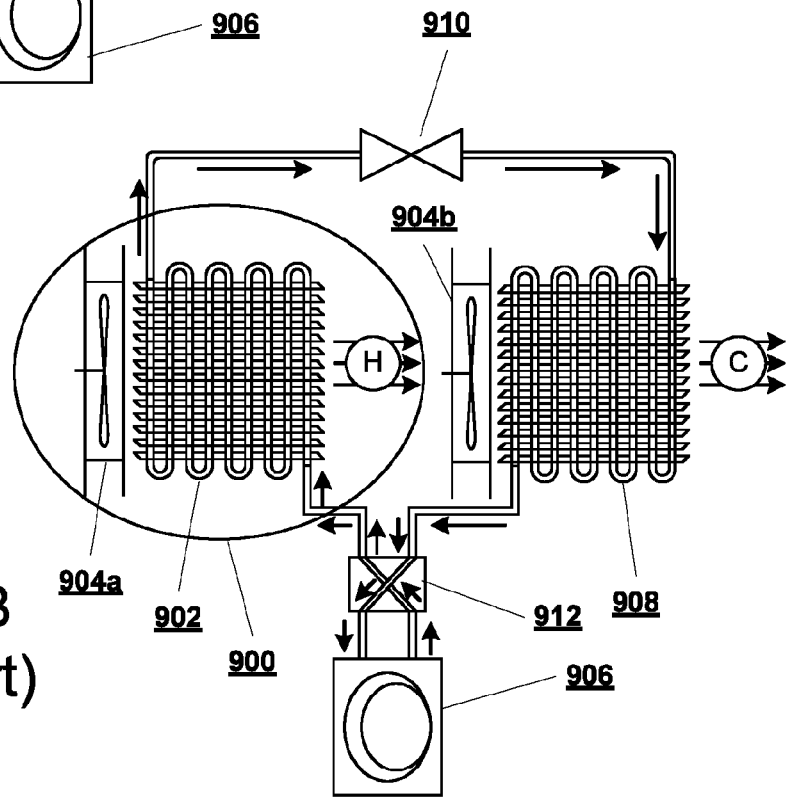

Finally, FIGS. 9A-9B respectively illustrate, in simplified overview form, an example of how some variants of the heat transfer units described herein can, by employing techniques well known in the prior art, function as both a cooling unit and a heat pump to, respectively, either cool or heat a spatial volume or enclosure 900.

Specifically, as shown in FIG. 9A, the spatial volume or enclosure 900 is to be cooled. As such, the coil 902 within that spatial volume or enclosure 900 will act as an evaporator coil such that, when a fan 904*a* causes the ambient gas in the spatial volume or enclosure 900 to pass over the coil 902, heat will be removed from the ambient gas. This is accomplished, in a conventional manner, by continuously circulating a refrigerant (directionally indicated by the arrows) from a compressor 906 to a coil 908 that acts as a condenser (over which a fan 904*b* will pass the ambient gas to remove heat from the coil 908), through an expansion/metering valve 910 to the coil 902 that acts as the evaporator.

Advantageously, through inclusion of a reversing valve 912 in the circuit, by changing the setting of the reversing valve 912, the direction of the refrigerant flow can be reversed through the coils, 902, 908 such that, as shown in FIG. 9B, the coil 902 in the spatial volume or enclosure 900 will now act as the condenser and the other coil 908 will now act as the evaporator.

In this manner, the same configuration of some heating unit implementation variants as described herein can be configured to either heat or cool merely by including a reversing valve in the refrigeration circuit and setting it accordingly.

Up to now, the heat transfer units discussed have been air conditioner (i.e., cooling) units or heat pumps. However, the foregoing is not limited to those types of devices, but rather should also be understood to encompass heat exchanger units as well.

Figure 10:
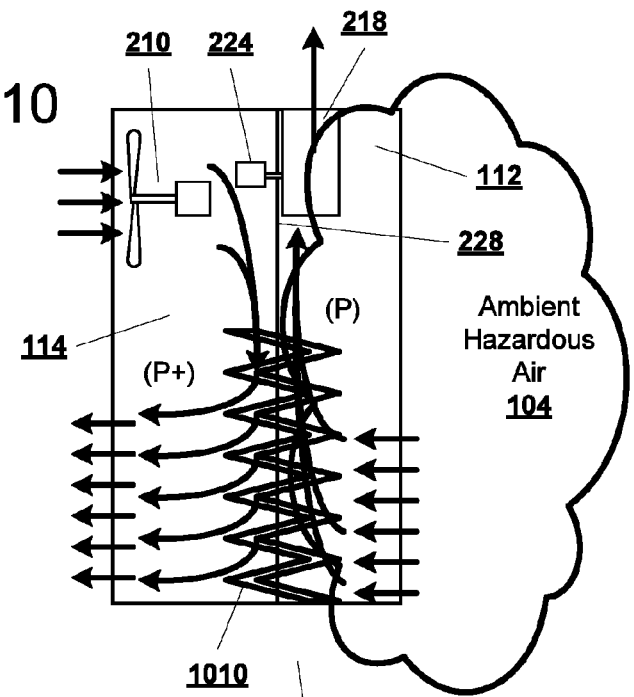
FIG. 10 illustrates, in simplified form, another example variant heat transfer unit, in this case, in the form of a air-to-air heat exchanger implementing the principles described herein.

In that regard, FIG. 10 illustrates, in simplified form, another example variant heat transfer unit 1000, in this case, in the form of a air-to-air heat exchanger implementing the principles described herein. As shown, many of the components are the same as previously discussed, however, this variant incorporates one or more plates or fin heat exchange components 1010 that is sealed to the dividing wall 228 between the two chambers 112, 114 such that the circulating air or gas in the first chamber 112 passes over or through the part of the plates or fin heat exchange components 1010 within that chamber 112 while circulating air or gas in the second chamber 114 passes over or through the part of the plates or fin heat exchange components 1010 within that chamber 114 so that heat (but not air) to be transferred, via the plates or fin heat exchange components 1010, between the two chambers 112, 114. Here too, depending upon the relative temperature difference, heat could be moved from the first chamber 112 to the second chamber 114 in some implementations and from the second chamber 114 to the first chamber 112 in other implementations.

As described above, when variants of this heat exchanger type heat transfer unit 1000 include a fan configuration where the blade-containing part of the unit 218 resides in the first chamber 112 and, in accordance with the description herein, its motor 224 resides in the second chamber 114, such that the shaft must pass through the separating wall 228 between them, the pressure in the second chamber 114 should be maintained at a higher pressure than the first chamber 112 pressure (in conjunction with a sufficiently tight or other suitable seal, for example, a labyrinth seal or other tortuous path seal) to minimize or eliminate the possibility of infiltration by the hazardous air 104 into the second chamber 114.

Figure 11A:
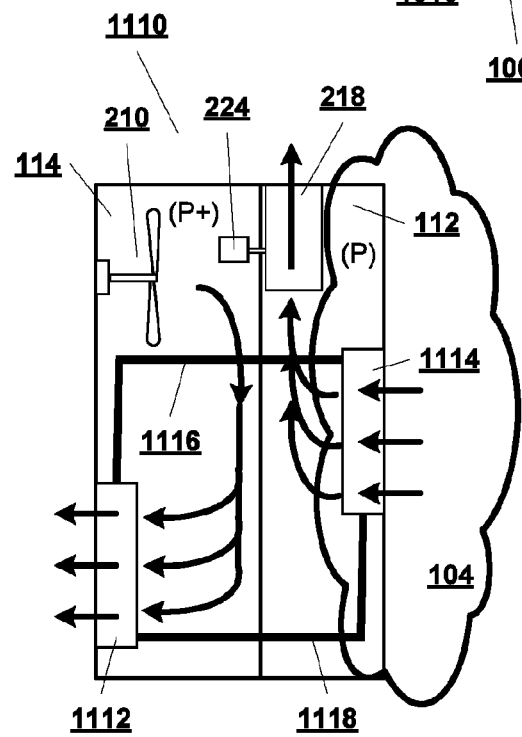
FIGS. 11A-11B respectively illustrate, in simplified overview form, still other example variant heat transfer units, in this case, in the form of thermo siphon type heat exchangers implementing the principles described herein.
Figure 11B:
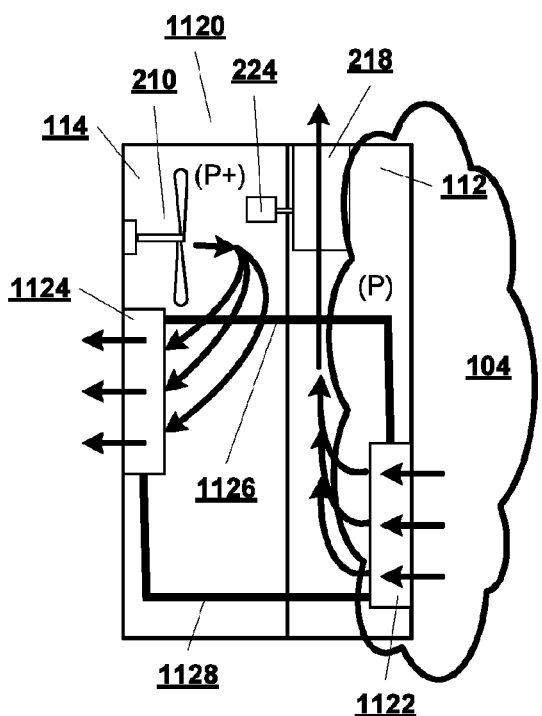

FIGS. 11A-11B respectively illustrate, in simplified overview form, still other example variant heat transfer units 1110, 1120, in this case, in the form of thermosiphon-type heat exchangers that implement the principles described herein.

Such heat transfer units 1110, 1120 do not use a compressor to circulate a cooling agent between two sets of coils that work as the evaporator 1112, 1122 and condenser 1114, 1124. Rather, they rely upon conventional principles wherein convection caused by changes in specific density, temperature difference, placement and gravity effect that circulation. Thus, with these type heat transfer units 1110, 1120, the coils that act as the evaporator 1112, 1122 are always physically located much lower than the coils that act as the condenser 1114, 1124. Thus, when the cooling agent in the evaporator 1112, 1122 undergoes a change from a liquid state to a gaseous state it rises up through piping 1116, 1126 to the coils that act as the condenser 1114, 1124 where it returns from a gaseous state to a liquid state and, via gravity, returns via other piping 1118, 1128 to the coils that act as the evaporator 1112, 1122.

Although not shown in FIGS. 10, 11A & 11B, it should be understood that the increased pressure in the chambers 114 could either be a result of a purge/pressurization system connected to that chamber 114 or, alternatively, due to higher pressure inert gas, air or nitrogen entering the chamber 114 from a cabinet to which it is attached.

Manufacturing Details

Having described the invention claimed with reference to various representative example implementation variants, some specific manufacturing variant details will now be provided with the understanding that these are only provided for completeness and that some may be mutually exclusive relative to others in that they cannot both be simultaneously part of the same implementation.

In this regard, some variant housings of the heat transfer units will be manufactured from aluminum or, in some cases, plastic or a plastic (or other insulator) coated metal. With some variants, the wall(s) dividing the two chambers will be solid welded, soldered or otherwise formed such that there are no seams between the two chambers through which the hazardous air might pass. Depending upon the particular implementation, the heat transfer unit can be configured such that hazardous air will enter from the bottom or one end of the unit and exit from the top or other end, or vice versa. The same will independently be the case with the atmosphere in the volume or enclosure to be heated or cooled.

The particular configuration and number of fans that will be used can vary, as can the type of fan (e.g., axial, centrifugal, etc.) used as the air movement element(s) within either or both chambers. In addition, if air movement from the volume or enclosure is sufficient, some variants may not need a fan in the chamber that is isolated from the hazardous air at all.

Likewise, in some less than preferred variants, it is not inconceivable that an explosion proof fan or some other "intrinsically safe" or "electrically safe" component could be located in the chamber through which the hazardous air would pass, and such variants should be understood to be encompassed herein provided a substantial number, or the most substantial potential ignition source components (in terms of danger or risk of causing ignition or explosion if exposed to the hazardous air) are still located in the chamber isolated from the hazardous air.

With respect to the shaft of a fan that passes through the wall separating the two compartments, the shaft should be sealed with a suitable rotary shaft seal so as to minimize the possibility of passage of hazardous air through the seal if not eliminate it entirely. Alternatively, the fan motor and blades could be coupled with a non-physical coupling (for example, a magnetic coupling) such that there would be no need for a shaft to pass through the wall separating the two compartments at all.

The coil(s) in either compartment may be single stage or multi-stage as the intended application requires, or space or design constraints dictate.

Where the hazardous air may contain particulates, the heat transfer unit may incorporate suitable filtration.

Finally, it is to be understood and appreciated that, in actual implementation, heat transfer units created according to the teachings herein will likely also include internal insulation, internal brackets for mounting the various components, external elements for mounting the unit to the housing to be cooled or heated and/or stabilizing the unit. For simplicity, such elements have not been shown and their lack of inclusion should not be taken as indicating a lack of presence. Only those elements or components pertinent to understanding the claimed invention have been included.

It should be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. In addition, as described, some variations or features may be mutually exclusive in that they cannot be simultaneously present in a single embodiment. That alternate embodiments may not have been presented for a specific portion in the context of the whole, or that further undescribed alternate embodiments may be available for a portion, is not to be considered a disclaimer of those alternate embodiments. One of ordinary skill will appreciate that many of those undescribed embodiments incorporate the same principles of the invention as claimed and others are equivalent.

What is claimed is:

1. A heat transfer unit for use in a location where heat will be transferred by the unit from a heat source in an enclosure to ambient hazardous air, the heat transfer unit comprising:
   a housing comprising
      a first compartment, configured for coupling to and removing heat from the enclosure, the first compartment having therein
         an evaporator, and
         potential ignition source elements within the heat transfer unit;
      a second compartment comprising
         an ambient hazardous air inlet, an ambient hazardous air outlet, and a condenser, the ambient hazardous air inlet and ambient hazardous air outlet being arranged within the second compartment such that, in use, ambient hazardous air will move into the second compartment via the ambient hazardous air inlet, past the condenser, and out the ambient hazardous air outlet;
   wherein the evaporator and condenser are coupled to each other via piping so as to collectively comprise a cooling circuit for passage of a cooling medium therebetween;
   wherein the first compartment is sealed off from the second compartment such that, during operation of the heat transfer unit, the first compartment will be sealed off from the ambient hazardous air; and
   wherein, the heat transfer unit is configured such that, during operation, an interior of the first compartment is maintained at an internal pressure that is higher than an interior pressure in the second compartment.

2. The heat transfer unit of claim 1, further comprising:
   a volume of ambient hazardous air in the second compartment.

3. The heat transfer unit of claim 1, further comprising:
   a pressurization system coupled to the first compartment and configured to maintain the first compartment at the internal pressure that is higher than the interior pressure in the second compartment.

4. The heat transfer unit of claim 3, further including an inlet positioned to direct one of nitrogen, an inert gas, or air, into the first compartment.

5. The heat transfer unit of claim 3, further comprising a seal between the first compartment and the second compartment, the seal being configured to operate in conjunction with the pressurization system to minimize infiltration of some of the hazardous ambient air from the second compartment into the first compartment.

6. The heat transfer unit of claim 1, further comprising:
   an inert gas within the first compartment.

7. The heat transfer unit of claim 1, further comprising, within the first compartment:
   blades of at least one of: a centrifugal fan, an axial fan or a propeller fan.

8. The heat transfer unit of claim 1, further comprising:
   an explosion proof fan, an intrinsically safe component or electrically safe component is located within the second compartment.

9. The heat transfer unit of claim 1, wherein the potential ignition source elements comprise conventional electrical components.

10. The heat transfer unit of claim 9, wherein the conventional electrical components include components that cause a spark.

11. The heat transfer unit of claim 9, wherein the conventional electrical components include components that heat to at least a temperature that will would cause the ambient hazardous air to ignite or explode.

12. A heat transfer unit for use in a location where heat will be transferred by the unit from a heat source to ambient hazardous air, the heat transfer unit comprising:
   a cooling circuit comprising an evaporator, a condenser, a coolant and passages to contain the coolant and allow the coolant to circulate between the evaporator and condenser;
   a first compartment including therein the evaporator and ignition source elements of the heat transfer unit; and
   a second compartment including the condenser and elements that are not ignition source elements therein;
   wherein, during operation of the heat transfer unit, heat removed from the heat source by the evaporator will be transferred to the ambient hazardous air, via the coolant of the cooling circuit, by passing the ambient hazardous air past coils of the condenser, and
   wherein the evaporator compartment is sealed off from the condenser compartment such that, during operation of the heat transfer unit, an internal pressure in the evaporator compartment will be higher than an internal pressure in the condenser compartment so as to minimize infiltration of the ambient hazardous air to the ignition source elements within the evaporator compartment of the heat transfer unit.

13. The heat transfer unit of claim 12, further comprising:
a purge and pressurization system coupled to the evaporator compartment.

14. The heat transfer unit of claim 12, further comprising:
blades of at least one of: a centrifugal fan, an axial fan or a propeller fan within the condenser compartment.

15. The heat transfer unit of claim 12, further comprising:
blades of at least one of: a centrifugal fan, an axial fan or a propeller fan within the evaporator compartment.

16. The heat transfer unit of claim 12, wherein at least a portion of the evaporator compartment and the condenser compartment are arranged in a side-by-side configuration.

17. The heat transfer unit of claim 12, wherein the evaporator compartment and the condenser compartment are arranged such that at least a portion of the evaporator compartment is above the condenser compartment.

18. The heat transfer unit of claim 12, wherein the elements that are not ignition source elements include explosion-proof components, or components and circuits designated intrinsically safe or electrically safe.

19. A heat transfer unit for use in a location where heat will be transferred by the unit from a heat source to ambient hazardous air, the heat transfer unit comprising:

a cooling circuit comprising an evaporator, a condenser, a coolant and passages to contain the coolant and allow the coolant to circulate between the evaporator and condenser;

a first compartment including therein the evaporator and any ignition source elements of the heat transfer unit; and a second compartment having no ignition source elements therein, but including at least the condenser therein;

wherein, during operation of the heat transfer unit, heat will be removed from the heat source by the evaporator and transferred to the ambient hazardous air, via the coolant of the cooling circuit, by passing the ambient hazardous air past the condenser using blades of a fan, and wherein the evaporator compartment is sealed off from the condenser compartment such that, during operation of the heat transfer unit, an internal pressure in the evaporator compartment will be higher than an internal pressure in the condenser compartment.

* * * * *